United States Patent [19]
Yukimoto

[11] 4,337,474
[45] Jun. 29, 1982

[54] SEMICONDUCTOR DEVICE

[75] Inventor: Yoshinori Yukimoto, Itami, Japan

[73] Assignee: Mitsubishi Denki Kabushiki Kaisha, Tokyo, Japan

[21] Appl. No.: 71,031

[22] Filed: Aug. 28, 1979

[30] Foreign Application Priority Data

Aug. 31, 1978 [JP] Japan .................................. 53/107114
Sep. 14, 1978 [JP] Japan .................................. 53/112937

[51] Int. Cl.³ .......................................... H01L 29/80
[52] U.S. Cl. ...................................... 357/22; 357/13; 357/37
[58] Field of Search ...................... 357/22, 13, 37, 34, 357/15

[56] References Cited

U.S. PATENT DOCUMENTS 3,408,544 10/1968 Teszner .................................. 357/20
3,891,479 6/1975 Zwernemann .......................... 357/15
4,115,793 9/1979 Nishizawa ............................. 357/22

*Primary Examiner*—Martin H. Edlow
*Attorney, Agent, or Firm*—Wenderoth, Lind & Ponack

[57] ABSTRACT

An n collector is sandwiched between an n+ collector a p base including an n+ emitter and includes a p+ gate connected to the base. Another n+ collector is disposed in the n− collector at the junction between the n− and n+ collector to oppose to the emitter and shaped to be parallel to a shape of a spread edge of a depletion layer from the gate. Alternatively an n collector may be substituted for the p base and include the p base from which the p+ gate extends through the n collector into the n− collector.

1 Claim, 8 Drawing Figures

(PRIOR ART)

(PRIOR DEVELOPMENT)

SEMICONDUCTOR DEVICE

BACKGROUND OF THE INVENTION

This invention relates to improvements in a semiconductor device including a collector, an emitter and a base region in a semiconductor substrate.

In order to increase the withstanding voltage of bipolar transistors and improve the high frequency characteristics thereof, there have been already proposed gate associated transistors comprising a first collector region highly doped, for example, with an n type impurity, a second n− type collector region disposed on the first n+ type collector region, a p type base region disposed in the second n− type collector region, an n+ type emitter region disposed in the p type base region, and an annular p+ type gate region extending from the p type base region in the second n− type collector region to encircle a current path along which the principal current flows between the emitter region and the collector regions. In such transistors it has been possible to increase the impurity concentration of the collector regions to increase the maximum usable current and also decrease the voltage drop at that current. However, this increase in impurity concentration has reduced the spread of a depletion layer in the n− type collector region resulting in a decrease in the withstanding voltage. That is, an increase in withstanding voltage has heretofore been incompatible with both an increase in maximum usable current and a decrease in voltage drop.

Accordingly it is an object of the present invention to provide a new and improved semiconductor device having a high withstanding voltage, and good high frequency characteristics while having a low power loss during operation.

It is another object of the present invention to provide a new and improved semiconductor device having a high withstanding voltage, good high frequency characteristics a high current capacity and a high output.

SUMMARY OF THE INVENTION

The present invention provides a semiconductor device comprising, in combination, a first collector region of a first type conductivity, a second collector region having the first type conductivity and disposed on the first collector region to form a first junction therebetween, the second collector region having a lower impurity concentration than the first collector region, a base region of a second type conductivity disposed adjacent to the second collector region to form a second junction therebetween, an emitter region of the first type conductivity disposed adjacent to the base region to form a third junction therebetween, an annular gate region of the second type conductivity disposed to encircle a current path along which a current flows between the emitter region and the first and second collector regions and also to form fourth junctions with the same and the second collector region, the gate region being connected to the base region so as to be at the same potential as the base region, and a third collector region of the first type conductivity disposed at least at a portion of the first junction opposite to the emitter region, the third collector region having a higher impurity concentration than the second collector region and shaped to parallel the shape of a depletion layer spreading from the gate region into the second collector region.

BRIEF DESCRIPTION OF THE DRAWINGS

The present invention will become more readily apparent from the following detailed description taken in conjunction with the accompanying drawings in which.

Throughout the figures like reference numerals designate the identical or corresponding components.

DESCRIPTION OF THE PREFERRED EMBODIMENTS

Figure 1:
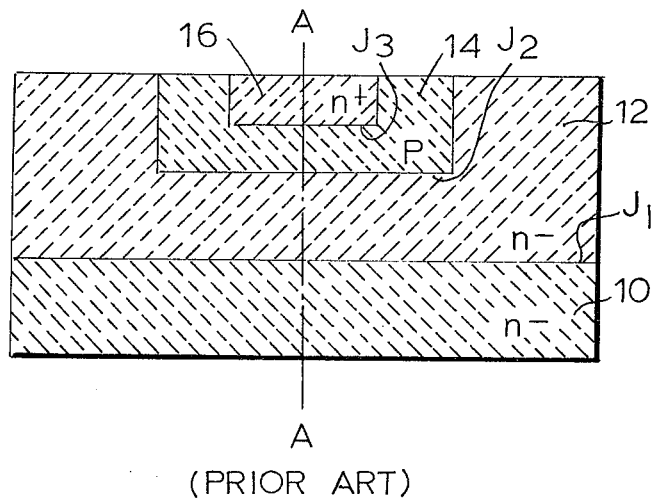
FIG. 1 is a longitudinal sectional view of a conventional semiconductor device.

Referring now to FIG. 1 of the drawings, there is illustrated a conventional semiconductor device. The arrangement illustrated comprises an n+ type collector region 10 with a high impurity concentration, an n− type active collector region 12 disposed on the region 10 to form a first junction $J_1$ therebetween, a p type base region 14 disposed in the n− type collector region 2 to form a second junction $J_2$ therebetween, and an n+ type emitter region 16 disposed in the p type collector region 14 to form a third junction $J_3$ therebetween. The surfaces of the regions 12, 14 and 16 are flush with one another. The purpose of the n+ collector region 10 is to decrease the collector resistance.

Figure 2:
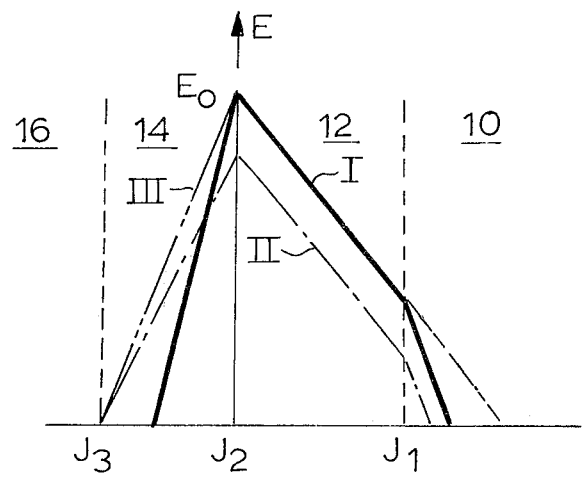
FIG. 2 is a graph illustrating distributions of electric field intensities in various portions of the arrangement shown in FIG. 1 and in a sectional plane designated by the line A—A' of FIG. 1.

The arrangement of FIG. 1 has an npn type transistor configuration and the operation of the respective regions 10, 12, 14 and 16 is well known in the art. Therefore the operation of those regions will not be herein described but a description will be given of the distribution of the electric field intensities developed in the arrangement of FIG. 1 having a reverse bias voltage applied across the p type base region 14 and the n+ collector region 10 and with reference to FIG. 2. In FIG. 2 wherein electric field intensity E is plotted on the ordinate against the distance along the line A—A' of FIG. 1 measured from the surface of the n+ type emitter region 16, there is illustrated distributions of the electric field intensities developed in a sectional plane along the line A—A'. In the case a reverse bias voltage is applied across the n+ type collector region 10 and the p type base region 14 with the emitter region 16 maintained in its open state, the withstanding voltage is determined only by the distribution of the electric field intensities developed about the second junction $J_2$ that is a pn junction and its magnitude. $BV_{CBO}$ is obtained when the electric field intensity at the second junction $J_2$ reaches a maximum breakdown intensity $E_O$ of the particular semiconductive material, for example, about $6 \times 10^5$ volts per centimeter for silicon crystals (see curve I or III, FIG. 2). On the other hand, the withstanding voltage is designated by $BV_{CEO}$ when a voltage is applied across the n+ type emitter region 16 and the n+ type collector region 10 with the base region 14 maintained in its open state. This withstanding voltage $BV_{CEO}$ is one of the important characteristics of common emitter amplifiers and the like. The factors which limit the withstanding voltage $BV_{CEO}$ are (1) the breakdown due to a punch-through which is caused by the depletion layer which spreads through the base region 14 due to the fact that the electric field reaches the third junction $J_3$ that is also a pn junction. In this case, the electric field intensity at the second junction $J_2$ does not reach the maximum breaking strength as shown at curve II in FIG. 2 because the base region 14 has a low impurity concentration or small base thickness equal to the distance between the second junction $J_2$ and the third junction $J_3$ and (2) the electric field intensity at the second junction $J_2$ reaches its maximum strength $E_O$ as shown at the curve I or III in FIG. 2. Since the electric field developed in each of the p type base and n type collector regions 14 or 12 has a slope determined by the impurity concentration of the associated region, the requirements for curves I, II and III as shown in FIG. 2 can be optionally selected.

Accordingly, in order to enable the arrangement of FIG. 1 to be operated at voltages of a high magnitude, it is desirable to select properly an impurity concentration of the p type base region 14 so as to cause the distribution of the electric field intensities in the p type base region 14 to approach the curve III as shown in FIG. 2. This is because the withstanding voltage is given by an area defined by a right-angled triangle including the curve III as its hypotenuse.

On the other hand, the frequency characteristics improve more as the thickness of the base region 14, i.e. the distance between the second and third junctions $J_2$ and $J_3$ respectively becomes smaller. Accordingly, the high frequency characteristics have been improved by making the base-thickness as small as possible while causing the base region 14 to be highly doped with a suitable impurity so as to prevent the depletion layer from spreading through the base region 14. The base region 14 having a high impurity concentration is effective for lowering the resistance, on the one hand, and decreases the efficiency with which electrons from the emitter regions 16 are injected into the base region 14, on the other hand. This results in the necessity of controlling the impurity concentration of the base region 14 to a suitable magnitude which indicates that it is impossible to make the thickness of the base region 14 infinitesimally small.

Figure 3:
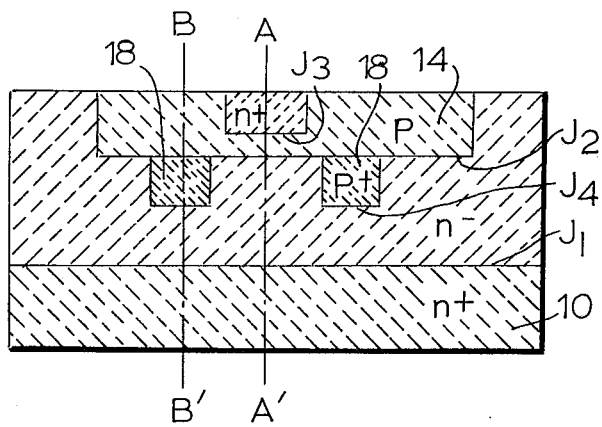
FIG. 3 is a view similar to FIG. 1 but illustrating another conventional semiconductor device.

From the foregoing it will readily be understood that steps taken for causing semiconductor devices to withstand high voltage contradict those taken to enable them to operate at high frequencies. For example, high frequency bipolar transistors sacrifice their high voltage operation. In order to solve this problem, there have been proposed transistors having the configuration as shown in FIG. 3. The arrangement illustrated in FIG. 3 is different from that shown in FIG. 1 only in that in FIG. 3 there is provided an annular gate region 18 extending from the p type base region 14 into the n− type collector region 12 coaxial with the central longitudinal axis A—A' thereby to encircle a path for the principal current flowing between the emitter region 16 and a collector layer consisting of the collector regions 10 and 12. The gate region 18 is identical in conductivity type to and has a higher impurity concentration than the base region 14. In the example illustrated, the gate region 18 is of the p+ type.

The arrangement of FIG. 3 is called a gate associated transistor which is abbreviated to "GAT."

Figure 4:
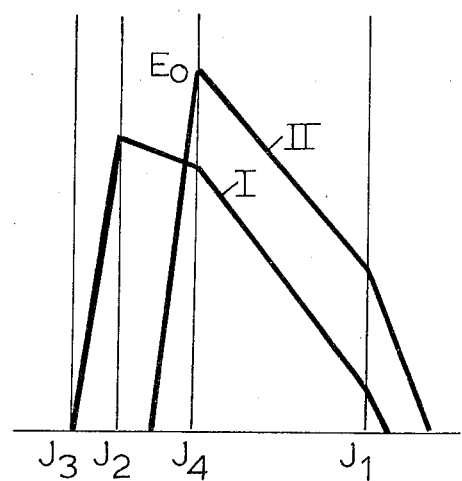
FIG. 4 is a graph illustrating distributions of electric field intensities in sectional planes designated by the lines A—A' and B—B' of FIG. 3.

The arrangement of FIG. 3 has the advantages as indicated by the distribution of electric field intensities as shown in FIG. 4 wherein the ordinates and abscissas are the same as those shown in FIG. 2. In FIG. 4 curve I shows the distribution of electric field intensities developed in a sectional plane designated by the line A—A' of FIG. 3 and extending through the center of the emitter region 16 and curve II shows another distribution of electric field intensities developed in a sectional plane designated by the line B—B' of FIG. 3 and passing centrally through the width of the gate region 18, in this case, lying to the left of the line A—A' as viewed in FIG. 3. Both curves I and II have been obtained with the same voltage applied across the arrangement of FIG. 3.

Curve II is substantially similar to curve I shown in FIG. 2 and has a withstanding voltage the value of which is determined by impurity concentrations of the n− type collector region 12 and the p+ type gate region 18 and curve I has a maximum electric field intensity smaller than that of curve II because the gate region 18 serves to decrease the slope of the electric field appearing between the second and fourth junctions $J_2$ and $J_4$ respectively. Therefore even though the base region 14 is sufficiently thin, punch-through is not caused. This permits the thickness of the base region 14 to be decreased without reducing the withstanding voltage and without changing the impurity concentration thereof. Thereby the resulting frequency characteristics can be improved. For example, when the base region 14 has an impurity concentration of $10^{17}$ atoms per cubic centimeter and the thickness of 1 μm, a punch-through voltage is 50 volts in the absence of the gate region 18. However, in the arrangement of FIG. 3 including the gate region 18 punch-through does not recur even with a voltage of 500 volts.

The reasons for which the distribution of electric field intensities is gentle between the second junction $J_2$ and the fourth junction $J_4$ is that depletion layers also spread along the radially outward and inward lateral sides of the gate region 18 to lower the electric field intensity along the sectional plane A—A' of FIG. 3. This spread of the depletion layers can be attained by pinching off that portion of the n− type collector region 12 encircled by the gate region 18. More specifically, it is required only to construct the gate region 18 so that the electric field intensity at the second junction $J_2$ is sufficiently high to cause the gate region 18 to promote spreading the depletion layers from the fourth junction $J_4$ along the sectional plane A—A' before a depletion layer within the base region 14 reaches the third junction $J_3$. If the n− type collector region 12 has formed therein the gate region 18 constructed to meet such a requirement and maintained at the same potential as the base region 14, there is provided a high voltage, high frequency transistor such as described above.

One may mention a maximum usable current and a voltage drop at that current as the other characteristic features of bipolar transistors. It is desirable to make the maximum usable current as high as possible while making the voltage drop as low as possible. To this end it is desirable to increase the impurity concentration of the collector layer as much as possible. However, an increase in impurity concentration causes the spread of the depletion layer to be reduced so as to decrease the withstanding voltage. Therefore an increase in withstanding voltage has been incompatible with both an increase in maximum usable current and a decrease in voltage drop.

Further the characteristic features of bipolar transistors include, in addition to the withstanding voltage and the frequency characteristics as described above, a maximum usable power as one of the important factors. An increase in withstanding voltage generally results in an increase in output. However, if it is assumed that the current density increases until a space charge limited current region is reached then the current at that time is proportional to the corresponding carrier concentration N while a withstanding voltage is substantially proportional to $N^{-\frac{1}{2}}$. Accordingly, the maximum usable power is proportional to $N^{\frac{1}{2}}$. This means that if N decreases for the purpose of providing a high withstanding voltage, then the maximum usable power decreases in proportion to $N^{\frac{1}{2}}$.

While the foregoing description has been made in conjunction with npn type transistors it is to be understood that the same is equally applicable to pnp type transistors.

Figure 5:
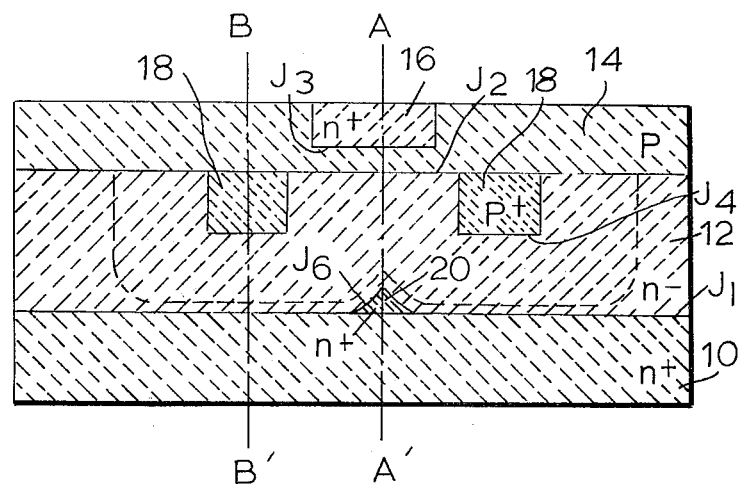
FIG. 5 is a longitudinal sectional view of one embodiment of the semiconductor device of the present invention.

Referring now to FIG. 5, there is illustrated one embodiment of a semiconductor device according to the present invention. The arrangement illustrated is different from that shown in FIG. 3 only in that in FIG. 5 another collector region 20 is disposed at least at that portion of the first junction $J_1$ between the n+ and n− collector regions 10 and 12 respectively opposite to the emitter region 16 and within the n− type collector region 12 and shaped so as to be parallel to the shape of a depletion layer spread from the annular gate region 18 at least at that portion of the spread edge opposite to the emitter region 16. The collecter region 20 is identical in conductivity type to and not less in impurity concentration than the n− type collector region 12. For example, the collector region 20 may have the same impurity concentration as the n+ type collector region 10. When disposing the n− type collector region 12 on the n+ type collector region 10, the collector region 20 may be partially disposed in place on the n+ type collector region 10 after which the n− type collector region 12 is disposed on both the remaining portion of the n+ type collector region 10 and the collector region 20 with a junction $J_6$ formed between the the n− type collector region 12 and the collector region 20. Alternatively, the n+ type collector region 10 may be provided on a predetermined portion with a region high doped with an n type impurity having a high diffusion velocity.

Figure 6:
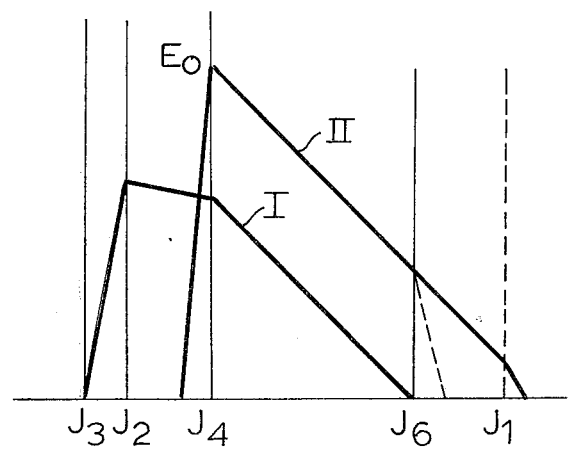
FIG. 6 is a graph illustrating distributions of electric field intensities in sectional planes designated by the lines A—A' and B—B' of FIG. 5.

FIG. 6 shows a pair of distributions of electric field intensities developed in sectional planes designated by the lines of A—A' and B—B' of FIG. 5 respectively. Curve II describes the distribution of electric field intensities developed in the sectional plane B—B' as in FIG. 4 and similar to that developed in usual pn junctions. Thus a depletion layer spreads substantially within the n− type collector region 12 only. Accordingly, the collector region 12 is formed with a reduced impurity concentration and an increased thickness for the purpose of making the resulting withstanding voltage high.

On the other hand, curve I describes the distribution of electric field intensities developed in the sectional plane A—A' as in FIG. 4 and having a maximum electric field intensity which is low as compared with curve II due to the action of the gate region 18 as described above in conjunction with FIG. 3. As a result, the depletion layer is only permitted to reach the vicinity of the junction $J_6$ between the n− and n+ type collector regions 12 and 20 respectively as shown by the dotted line in FIG. 5.

On the other hand, conventional devices such as shown in FIG. 3 have not included the highly doped collector region 20, but instead a portion of the n− type collector region 12 is present in place of the collector region 20. Under these circumstances that portion of the n− type collector region located between the junctions $J_6$ and $J_1$ acts as a resistor which causes a voltage drop thereacross and therefore a heat loss resulting in a decrease in efficiency. However, in the arrangement of FIG. 5, the highly doped collector region 20 is disposed parallel to the shape of the spread edge of the depletion layer spread from the gate region 18 so as to eliminate or substantially decrease the resistance region. This results in a decrease in power loss.

From the foregoing it is seen that the arrangement of FIG. 4 has a high withstanding voltage, has good high frequency characteristics and low power loss while having a simple construction and being capable of being easily manufactured.

Figure 7:
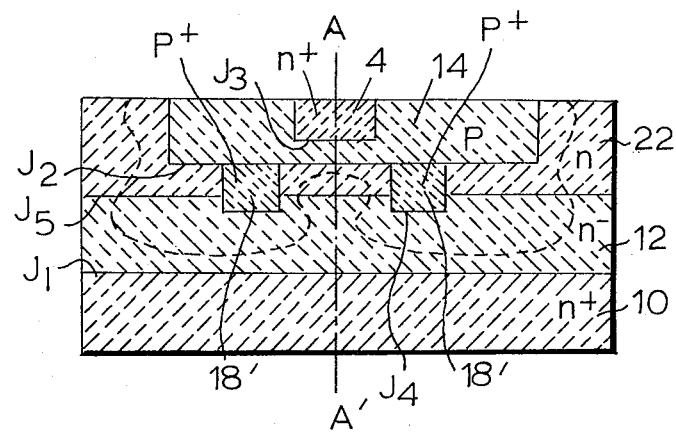
FIG. 7 is a view similar to FIG. 5 but illustrating a modification of the present invention.

FIG. 7 shows a modification of the present invention. The arrangement illustrated is different from that shown in FIG. 3 only in that in FIG. 7 an n type collector region 22 having a higher impurity concentration than the n− type collector region 12 is disposed on the latter and the p type base region 14 is disposed in the same while the p+ type annular gate region 18' extending from the p type have region 14 extends through both the n type collector region 22 and a fifth junction $J_5$ formed between the regions 22 and 12 and protrudes into the n− type collector region 12. The gate region 18 is indentical in conductivity type to and has a higher impurity concentration than the base region 14.

Figure 8:
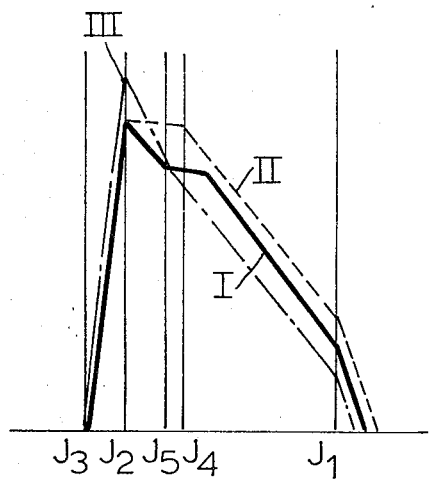
FIG. 8 is a graph illustrating distributions of electric field intensities in a sectional plane designated by the line A—A' of FIG. 7 with the parameters changed in the arrangement shown in FIG. 7.

FIG. 8 shows different distributions of electric field intensities developed in a sectional plane designated by the line A—A' of FIG. 7. Curve I describes the distribution of electric field intensities with the n type collector region 22 higher in impurity concentration than the n− type collector region 12 as described above and curve II describes the distribution of electric field intensities with the n type collector region 22 equal in impurity concentration to the n− type collector region 12. In the absence of the gate region 18', the distribution of electric field intensities is designated by curve III.

When reverse bias voltages are applied across the p type base region 14 and the n+ type collector region 10 or the pn junction $J_2$ and across the p+ type gate regions 18' and the n+ type collector region 10 or the pn junction $J_4$, a depletion layer spreads in both that portion of the n type collector region 22 located between the junctions $J_2$ and $J_5$ and that portion of the n− type collector region 12 located between the junctions $J_5$ and $J_1$ as shown by the dotted line in FIG. 7. However, as the n type collector region 22 has a higher impurity concentration than the n− type collector region 12, the spread of the depletion layers is smaller in the n type collector region 22 than in the n− type collector region 12. This results in curve I shown in FIG. 8. More specifically, the electric field has a slope determined by the impurity concentration of the n⁻ type collector region 12 between the junction J₁ and the vicinity of the junction J₄ or a plane parallel to the junction J₄ and more or less displaced from the junction J₄ toward the junction J₁ due to the presence of the n⁻ type collector region 12 with a lower impurity concentration than the n type collector region 22. Between that plane and the junction J₅, the gate regions 18' exist to promote in spreading the depletion layer whereby the electric field has a slope smaller than that resulting from the impurity concentration of the n⁻ type collector region 12. Further between the junctions J₅ and J₂, the electric field has a slope more gentle than that determined by the impurity concentration of the n type collector region 22 because of the action of the gate region 18'. The electric field has a maximum intensity at the junction J₂ after the distribution of electric field intensities is determined by the impurity concentration of the base region 16 and substantially identical to that designated by curve II in FIG. 8 until the junction J₃ is reached. That is, the resulting withstanding voltage is high and approximately that obtained when the n type collector region 22 has an equal impurity concentration to the n⁻ type collector region 12. In addition, the resulting current density is high due to the n type collector region 22 having a higher impurity concentration than the n⁻ type collector region 12.

Therefore the arrangement of FIG. 7 has a high operating current and a high output while having good high frequency characteristics.

As described above, the distribution of electric field intensities in the absence of the gate region 18 is designated by curve III. By comparing curve III with curve I it is seen that between the vicinity of the junction J₄ and the junction J₅ and between the junctions J₅ and J₂, the electric field has a slope as shown by curve III greater than that shown by curve I and a maximum intensity at the junction J₂ as shown by curve III is higher than that shown by curve I. Therefore a depletion layer spreads into the entire base region 14 resulting in the occurrence of a punch-through.

While the present invention has been illustrated and described in conjunction with a few preferred embodiments thereof it is to be understood that numerous changes and modifications may be resorted to without departing from the spirit and scope of the present invention. For example, the present invention is equally applicable to an npn structure. Also the gate region may extend to a surface region of the arrangement illustrated. Further the gate region may be separated from the base region 16 and disposed in each of the collector region 12 and the highly doped region 22 with the gate region in the region 12 electrically connected to that in the region 22 through an external or an internal connection.

It will readily be understood that the present invention can be easily constructed by a combination of gaseous phase growth, diffusion, ion implantation etc. well known in the art of semiconductor production.

What is claimed is:

1. A semiconductor device comprising, in combination, a first collector region of a first type conductivity, a second collector region having the first type conductivity and disposed on said first collector region and forming a first junction therebetween, said second collector region having an impurity concentration less than the impurity concentration of said first collector region, a base region of a second type conductivity disposed adjacent to said second collector region and forming a second junction therebetween, an emitter region of the first type conductivity disposed adjacent to said base region and forming a third junction therebetween and positioned for forming a current path along which a current flows between said emitter region and said first and second collector regions and also forming fourth junctions between said emitter region and said second collector region, and an annular gate region of the second type conductivity around said current path and extending from said base region into said second collector region, said gate region being connected to said base region for being at the same potential as said base region, and a third collector region of the first type conductivity disposed between said second collector region and said base region and having a higher impurity concentration than that of said second collector region and forming junctions with each of said second collector region and said base region and said annular gate region projecting through said third collector region into said second collector region and being surrounded by said third collector region.

* * * * *